(12) United States Patent
Horgnies et al.

(10) Patent No.: US 10,882,213 B2
(45) Date of Patent: Jan. 5, 2021

(54) METHOD FOR MANUFACTURING A PRE-FABRICATED PHOTOVOLTAIC CONSTRUCTION ELEMENT

(71) Applicant: HOLCIM TECHNOLOGY LTD, Jona (CH)

(72) Inventors: Matthieu Horgnies, Saint Quentin Fallavier (FR); Isabelle Dubois-Brugger, Saint Quentin Fallavier (FR); Fabienne Legrand, Saint Quentin Fallavier (FR); Gérard Molines, Saint Quentin Fallavier (FR)

(73) Assignee: HOLCIM TECHNOLOGY LTD, Jona (CH)

( * ) Notice: Subject to any disclaimer, the term of this patent is extended or adjusted under 35 U.S.C. 154(b) by 96 days.

(21) Appl. No.: 15/762,016

(22) PCT Filed: Sep. 23, 2016

(86) PCT No.: PCT/FR2016/052425
§ 371 (c)(1),
(2) Date: Mar. 21, 2018

(87) PCT Pub. No.: WO2017/051137
PCT Pub. Date: Mar. 30, 2017

(65) Prior Publication Data
US 2018/0257260 A1  Sep. 13, 2018

(30) Foreign Application Priority Data

Sep. 25, 2015  (FR) ..................... 15 59076

(51) Int. Cl.
*B28B 19/00*  (2006.01)
*B28B 23/00*  (2006.01)
*H02S 20/26*  (2014.01)
*H01L 31/02*  (2006.01)
(Continued)

(52) U.S. Cl.
CPC ........ *B28B 19/0053* (2013.01); *B28B 11/046* (2013.01); *B28B 11/048* (2013.01);
(Continued)

(58) Field of Classification Search
None
See application file for complete search history.

(56) References Cited

U.S. PATENT DOCUMENTS

2012/0110932 A1*  5/2012  Ehbing .................... E04D 1/16
                                                52/173.3
2014/0144491 A1   5/2014  Galliano et al.
(Continued)

FOREIGN PATENT DOCUMENTS

DE   32 47 468 A1   7/1984
DE   41 41 414 A1   5/1993
(Continued)

OTHER PUBLICATIONS

International Search Report as issued in International Patent Application No. PCT/FR2016/052425, dated Jan. 23, 2017.

*Primary Examiner* — Edmund H Lee
(74) *Attorney, Agent, or Firm* — Pillsbury Winthrop Shaw Pittman LLP

(57) ABSTRACT

A method for manufacturing a pre-fabricated element for construction and electricity production includes providing a formwork mould; introducing a photovoltaic module into the formwork mould, and for this purpose vertically positioning the photovoltaic module against or in replacement of one of the walls of the formwork mould, the front face of the at least one photovoltaic module being arranged so as to face an area of the space located outside the mould; depositing an adhesive structural material or a mixture of adhesive structural materials on all or part of the rear face of the at least one photovoltaic module arranged so as to face an area of the space located inside the mould, the adhesive structural
(Continued)

material including at least one polymer from the epoxide, polyurethane, acrylic, or styrene-acrylic family, and pouring fresh concrete into the formwork mould so as to cover the adhesive structural material.

11 Claims, 2 Drawing Sheets

(51) Int. Cl.
    *B28B 11/04*     (2006.01)
    *B28B 11/08*     (2006.01)
    *B28B 11/24*     (2006.01)

(52) U.S. Cl.
    CPC .......... *B28B 11/0872* (2013.01); *B28B 11/24* (2013.01); *B28B 23/00* (2013.01); *H01L 31/02013* (2013.01); *H02S 20/26* (2014.12); *Y02B 10/10* (2013.01)

(56) References Cited

U.S. PATENT DOCUMENTS

| | | | |
|---|---|---|---|
| 2014/0150847 A1* | 6/2014 | Chen | H01L 31/0481 136/247 |
| 2016/0203919 A1* | 7/2016 | Lee | H01G 9/2077 136/259 |
| 2016/0233367 A1* | 8/2016 | Chou | H01L 31/0547 |
| 2017/0141719 A1* | 5/2017 | Horgnies | C04B 41/52 |

FOREIGN PATENT DOCUMENTS

| | | |
|---|---|---|
| FR | 2 734 753 A1 | 12/1996 |
| FR | 3 022 240 A1 | 12/2015 |
| JP | 2002-368249 A | 12/2002 |
| WO | WO 97/15953 A1 | 5/1997 |

* cited by examiner

METHOD FOR MANUFACTURING A PRE-FABRICATED PHOTOVOLTAIC CONSTRUCTION ELEMENT

CROSS-REFERENCE TO RELATED APPLICATIONS

This application is the U.S. National Stage of International Application Serial No. PCT/FR2016/052425, filed Sep. 23, 2016, which in turn claims priority to French Application No. 1559076, filed Sep. 25, 2015. The contents of all of these applications are incorporated herein by reference in their entirety.

CONTEXT OF THE INVENTION

The present invention relates to the technical field of the production of electricity from renewable energies, in particular solar energy, thanks to the photovoltaic effect.

More specifically, the present invention relates to a method for manufacturing a pre-fabricated element intended for construction and comprising at least one photovoltaic module intended for producing electricity.

The energy crisis and environmental considerations are pushing industry to find energy saving and environmentally friendly solutions. Photovoltaic solutions can contribute to this effort by providing innovating solutions in numerous fields, notably the technical field of concrete.

Indeed, towns and cities include numerous buildings, blocks of flats, engineering works or infrastructures (notably transport) made of concrete and offering large surface capacities that it would be pertinent to use for producing electricity from solar energy.

It is known to install photovoltaic panels on concrete surfaces subsequent to the construction of said surfaces.

However, such installations required beforehand the installation of a bearing structure which sometimes requires certain adaptations to conform to the concrete surface on which the photovoltaic panels are intended to be installed.

Furthermore, such an installation necessitates resorting to specialised labour.

Thus, it would appear to be interesting to use the concrete surfaces available in towns and cities and to do so as of their construction in such a way as to limit resorting later to additional resources.

The patent application FR14/55388 describes a method for manufacturing a pre-fabricated concrete element intended for producing buildings, blocks of flats, engineering works or infrastructures and capable of producing electricity.

This pre-fabricated element includes a thin photovoltaic layer deposited on one of these surfaces, which does not necessitate having to resort to a bearing structure to manufacture a photovoltaic panel from a plurality of these elements.

Such a method consists in coating the surface of a hardened concrete with a polymer film obtained by polymerisation under the action of radiation, then depositing a thin photovoltaic film on this film polymer using techniques of which the basic principle consists in depositing or condensing the covering material forming the thin film under partial vacuum, for example, using a pressure of $10^{-2}$ to $10^{-4}$ Torr, whereas the support material is heated to a constant temperature.

This method is satisfactory as regards the adherence of the thin photovoltaic film on the surface of the concrete element.

Nevertheless, such a method requires the implementation of complex techniques which it is difficult to master during mass production at an industrial scale.

DESCRIPTION OF THE INVENTION

The present invention aims to resolve all or part of the problems described above.

Also, the technical problem that the present invention proposes solving consists in simplifying the method for manufacturing a pre-fabricated element intended for construction and comprising a photovoltaic module intended for producing electricity.

With this aim, the present invention relates to a method for manufacturing a pre-fabricated element for construction and electricity production including the following steps:

provideing at least one photovoltaic module, said at least one photovoltaic module having a front face intended to be oriented towards a light source and a rear face opposite to the front face, said photovoltaic module being covered with a transparent polymer, providing a formwork mould, introducing the at least one photovoltaic module into the formwork mould, and for this purpose:

positioning the at least one photovoltaic module against one of the side walls of the formwork mould, the front face of the at least one photovoltaic module being arranged so as to face said wall, and/or replacing one of the side walls of the formwork mould by all or part of the at least one photovoltaic module, the front face of the at least one photovoltaic module being arranged so as to face an area of the space located outside the mould, depositing an adhesive structural material or a mixture of adhesive structural materials on all or part of the rear face of the at least one photovoltaic module arranged so as to face an area of the space located inside the mould, the adhesive structural material including at least one polymer from the epoxide, polyurethane, acrylic, or styrene-acrylic family, pouring fresh concrete into the formwork mould so as to cover the adhesive structural material.

A pre-fabricated element intended for construction according to the present invention may be any element or part of an element of a construction such as for example a foundation, a wall base, a wall, a beam, a pillar, a bridge pier, a breeze block, a building block, a post, a staircase, a panel, notably a façade panel, a cornice, a tile or a roof terrace.

Nevertheless such a pre-fabricated element is also intended for the production of electricity and thus has to be able to be exposed to a light source, notably the sun.

Unexpectedly, the inventors have demonstrated that it is possible to make a photovoltaic module adhere in an appropriate manner on fresh concrete using an adhesive structural material which, contrary to received wisdom, does not lose its adherence on account of its use with fresh concrete.

This method makes it possible to simplify considerably the manufacture of pre-fabricated concrete elements including a photovoltaic module.

Indeed, the placement and the bonding of the photovoltaic module directly in contact with the formwork mould enables a very appreciable time saving, typically less than one day compared to the steps of bonding or laminating a photovoltaic module on already hardened concrete conventionally requiring several days.

In addition, this method is free of any problem of degassing of water and makes it possible to mould more easily the shape and the dimensions of concrete panels, while easily providing the space necessary for the outlet of the electrical connectors.

According to one embodiment of the method, the at least one photovoltaic module is positioned horizontally against one of the walls of the formwork mould, in particular the bottom wall of the formwork mould.

This arrangement makes it possible to transfer onto one of the more resistant walls of the formwork mould all or part of the force that the fresh concrete exerts on the at least one photovoltaic module, which preserves the photovoltaic module.

According to one embodiment of the method, the at least one photovoltaic module is positioned vertically against one of the walls of the formwork mould, in particular a side wall of the formwork mould.

This arrangement makes it possible to envisage a pre-fabricated element including several photovoltaic modules arranged on the different sides of the element.

According to one embodiment of the method, the method further includes a prior step of sand-blasting the rear face of the at least one photovoltaic module.

This arrangement makes it possible to increase the specific surface area of the rear face of the at least one photovoltaic module and thus to increase the adhesion of the adhesive structural material.

According to one embodiment of the method, the adhesive structural material is applied by spray, by roller or by brush.

This arrangement makes it possible to simplify the application of the adhesive structural material.

According to one embodiment of the method, the adhesive structural material includes at least one polymer, for example from the epoxide, polyurethane, acrylic, or styrene-acrylic family.

According to one embodiment of the method, the method further includes a step of drying or cross-linking of the polymer before the step consisting in pouring the fresh concrete.

This step may for example be implemented when the adhesive structural material is a polymer of the styrene-acrylic family.

According to one embodiment of the method, the concrete has a water/cement (W/C) ratio of at the most 1, preferably from 0.20 to 0.27.

According to one embodiment of the method, the concrete is a high performance concrete, an ultra-high performance concrete, a self-compacting concrete or a foamed concrete.

This type of concrete adheres particularly well to the adhesive structural material.

According to one embodiment of the method, the method further includes a later step of removing from the mould, preferably 18 hours after the step of pouring the fresh concrete.

According to one embodiment of the method, the method further includes a later step of thermal treatment after the step of removing from the mould.

This arrangement makes it possible to improve the cohesion between the different materials used to produce the pre-fabricated element.

The present invention also relates to a pre-fabricated element capable of being obtained by a method as described previously wherein at least one part of the connectors of the at least one photovoltaic module are set in the concrete.

PRESENTATION OF THE FIGURES

In any case, the invention will be better understood by means of the description that follows, with reference to the appended schematic drawing representing, as a non-limiting example, the different steps of a method for manufacturing a pre-fabricated element according to the invention.

DETAILED DESCRIPTION

Figure 1:
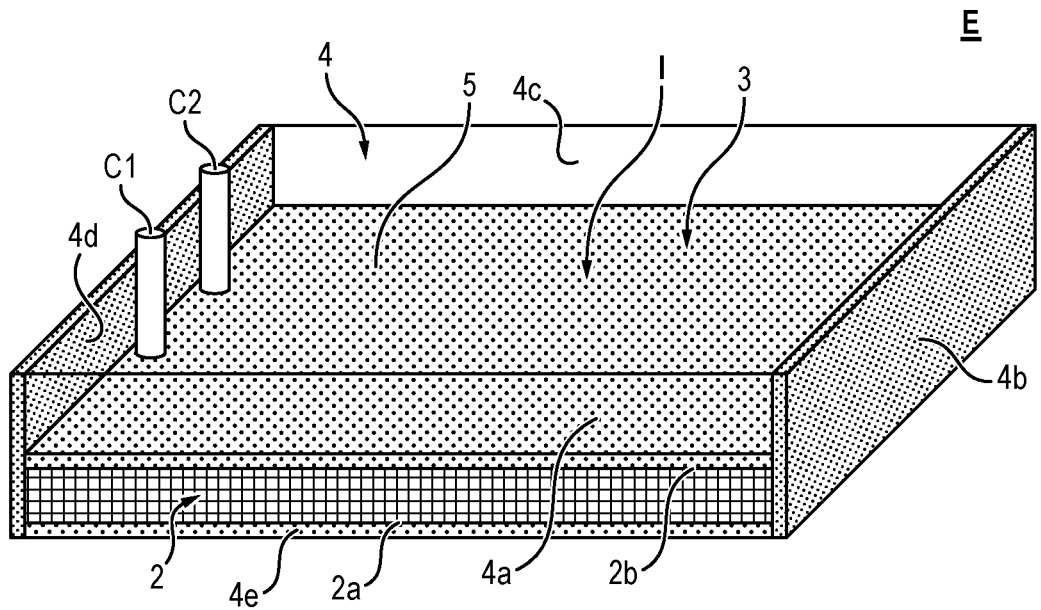
FIG. 1 illustrates the layout between the formwork mould and the photovoltaic module according to a first implementation of the method according to the invention.
Figure 3:
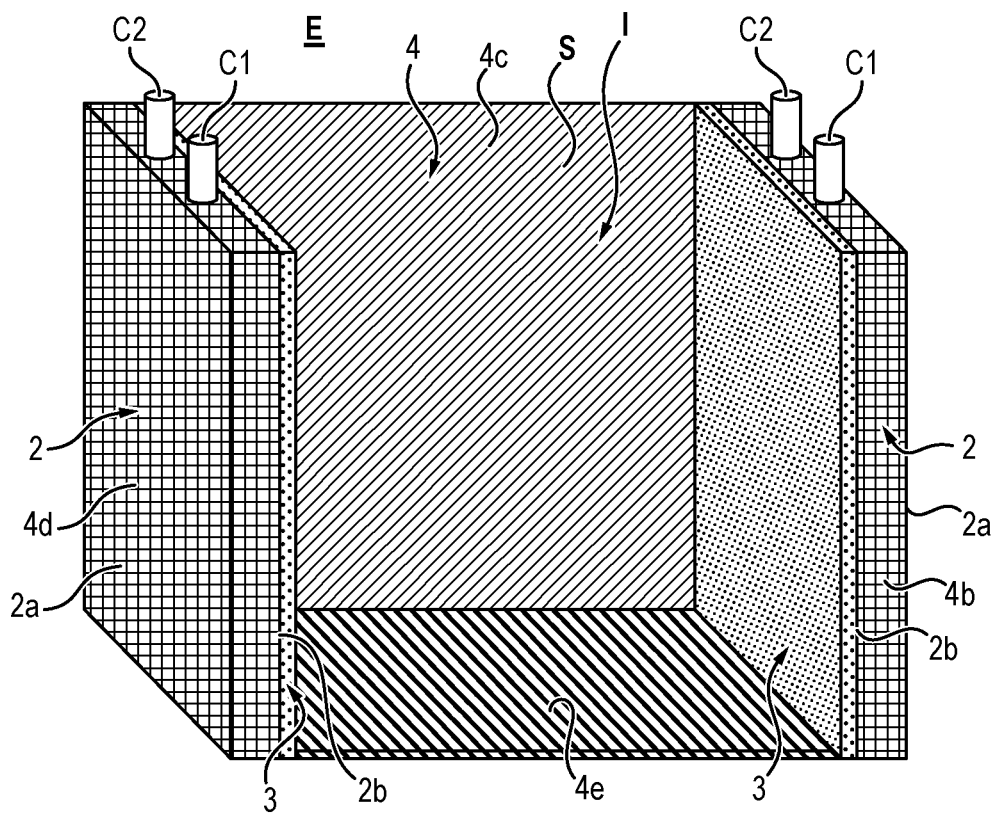
FIG. 3 illustrates the layout between the formwork mould and the photovoltaic module according to a second implementation of the method according to the invention.

As illustrated in FIGS. 1 and 3, the implementation of a method for manufacturing a pre-fabricated element 1 intended for construction and electricity production according to the invention firstly consists in providing at least one photovoltaic module 2 intended for producing electricity.

Figure 2:
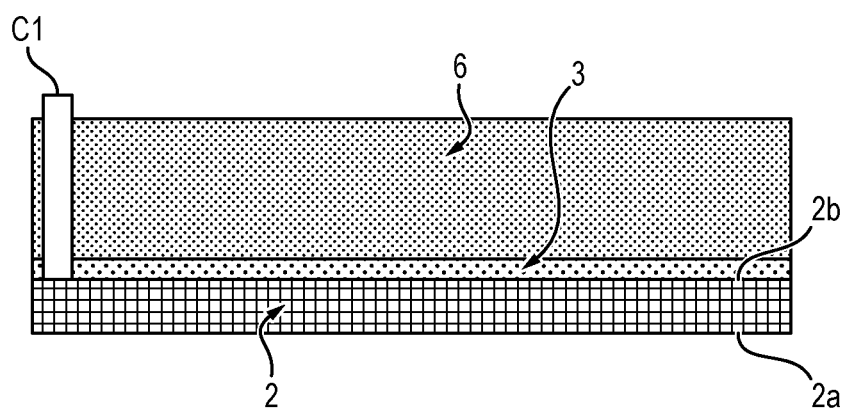
FIG. 2 is a profile view of a pre-fabricated element obtained from the first implementation of the method according to the invention illustrated in FIG. 1.
Figure 4:
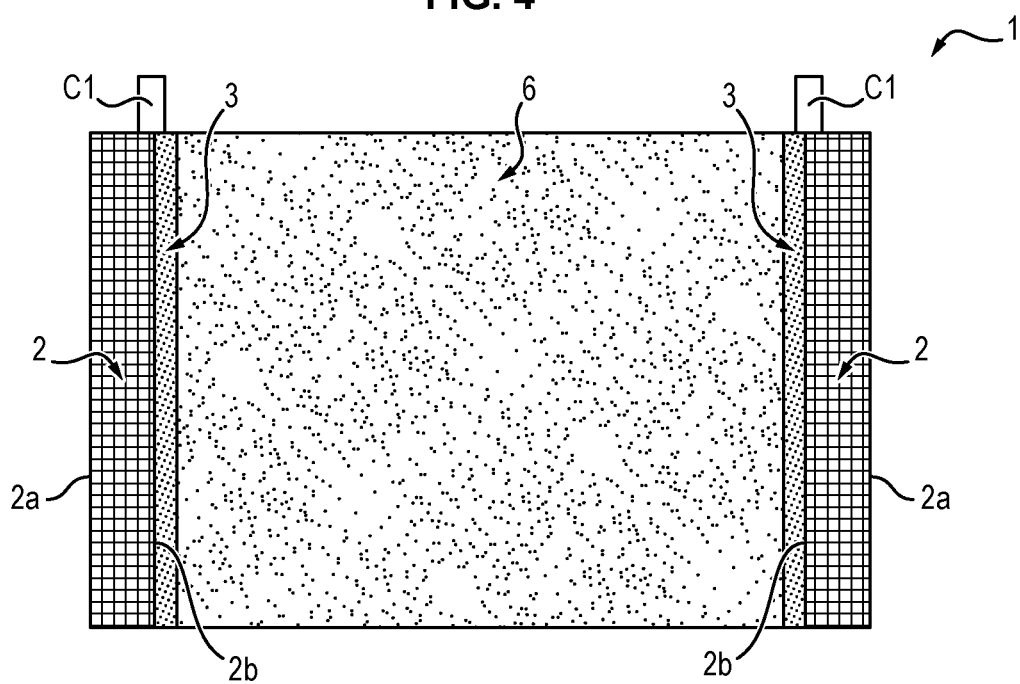
FIG. 4 is a profile view of a pre-fabricated element obtained from the second implementation of the method according to the invention illustrated in FIG. 3.

In the example of FIGS. 1 and 2, the pre-fabricated element 1 includes a single photovoltaic module 2 whereas in the example presented in FIGS. 3 and 4 the pre-fabricated element includes two photovoltaic modules 2.

Obviously, the present invention could include a different number of photovoltaic modules 2, this number being determined according to the applications envisaged for the pre-fabricated element 1.

A photovoltaic module 2 generally includes a plurality of photovoltaic cells electrically connected together in series.

The photovoltaic cells may be based on mineral compounds, metal compounds, organic compounds or hybrid organic-mineral compounds also called hybrid photovoltaic cells.

The mineral or metal compounds suitable for producing the photovoltaic cells may be based on amorphous silicon, crystalline silicon, polycrystalline silicon, liquid silicon, cadmium telluride, copper-indium-selenium, copper-indium-gallium-selenium, copper-indium-gallium-diselenide-disulphide, gallium arsenide, copper-zinc-tin-selenium, copper-zinc-tin-diselenide-disulphide, indium-tin oxide, copper, molybdenum, chalcopyrite or mixtures thereof.

The organic compounds suitable for producing the photovoltaic cells may be based on two compounds, one electron donor and the other electron acceptor. Among electron donors, polyarylenes, poly(arylene-vinylene)s, poly(arylenes-ethynylene)s or mixtures thereof may be cited.

As an example, poly 3-hexyl thiophene (also designated P3HT)) or poly[2-methoxy-5-(3,7-dimethyloctyloxy)-1,4-phenylene-vinylene] (also designated MDMO-PPV) may be cited.

Among electron acceptors, fullerene based compounds such as methyl [6,6]-phenyl-C61-butanoate (also designated PCBM) may be cited.

It may also be envisaged that the photovoltaic cells may be composed of photosensitive pigments; they are then known as dye sensitised solar cells or Gratzel cells (also designated DSSC or DSC). Among photosensitive pigments composing the dye sensitised cells or Gratzel cells, titanium oxide could be cited.

All of the photovoltaic cells forming a photovoltaic module 2 are covered with a transparent polymer that can withstand external aggressions (water, air, UV, etc.).

This polymer will serve as preferred support for an adhesive structural material described hereafter in the text.

The photovoltaic module 2 has the shape of a rectangular panel with a front face 2a and a rear face 2b.

The front face 2a is intended to be oriented towards a light source in such a way as to enable the photovoltaic cells to generate the photovoltaic effect.

The rear face 2b is for its part opposite to the front face 2a.

Moreover, the photovoltaic module 2 includes two electrical connectors C1, C2 projecting from the rear face 2b.

These electrical connectors C1, C2 are used to recover the electricity produced by the photovoltaic module 2.

The second step of the method for manufacturing according to the invention consists in providing a formwork mould 4.

In the example proposed, the formwork mould 4 has the general shape of a parallelepiped including several walls, of which four side walls 4a, 4b, 4c, 4d positioned vertically and a bottom wall 4e positioned horizontally.

These walls 4a, 4b, 4c, 4d, 4e define two areas of the space, a first area of the space located inside the formwork mould 4, designated inner area I of the formwork mould 4, and a second area of the space located outside the formwork mould 4, designated outer area E of the formwork mould 4.

Moreover, the formwork mould also includes an opening 5 arranged so as to face the bottom 4e, and used during a later step for the introduction of fresh concrete 6 into the formwork mould 4.

The formwork mould 4 used may be produced from several materials, such as bakelized wood, polyvinyl chloride (PVC), polydimethylsiloxane (PDMS) or even steel.

After this step, several alternatives may be envisaged for introducing the photovoltaic mould 2 into the formwork mould 4.

A first of these alternatives consists in positioning the at least one photovoltaic module 2 against one of the walls 4a, 4b, 4c, 4d, 4e of the formwork mould 4, the front face 2a of the photovoltaic module 2 being arranged so as to face said wall 4a, 4b, 4c, 4d, 4e.

Preferably, the photovoltaic module 2 is dimensioned in such a way that its front face 2a entirely covers the inner face of the wall 4a, 4b, 4c, 4d, 4e against which it is positioned.

In the example illustrated in FIGS. 1 and 2, the photovoltaic module 2 has been positioned against the bottom wall 2e.

A second of these alternatives consists in replacing one of the walls 4a, 4b, 4c, 4d, 4e of the formwork mould by all or part of the at least one photovoltaic module 2, the front face 2a of the photovoltaic module 2 being arranged so as to face an area located outside the formwork mould 4.

In the example illustrated in FIGS. 3 and 4, the pre-fabricated element 1 includes two photovoltaic modules 2, both arranged vertically and replacing two opposite side walls 4a, 4b, 4c, 4d.

Thus, the two photovoltaic modules 2 are used as lost formworks.

In this alternative, end portions of the rear face 2b may be positioned facing the flank of other adjacent walls of the formwork mould 4.

The affixing of a leak-tight seal between these end portions of the rear face 2b of the photovoltaic module 2 and a wall 4a, 4b, 4c, 4d, 4e of the formwork mould 4 or end portions of the rear face 2b of another photovoltaic module 2, potentially reinforced by a metal frame arranged around the formwork mould 4 and acting as a clamp, could be used to assure the cohesion between the different walls 4a, 4b, 4c, 4d, 4e of the formwork mould 4.

A combination of these two alternatives may also be envisaged, for example by positioning the front face of a photovoltaic module 2 against one wall 4a, 4b, 4c, 4d, 4e of the formwork mould 4, and by replacing another of these walls 4a, 4b, 4c, 4d, 4e by a photovoltaic module 2 of which the front face would be oriented facing the outer area E of the formwork mould 4.

The method according to the invention also includes a step consisting in depositing an adhesive structural material 3 on all or part of the rear face 2b of the at least one photovoltaic module 2 arranged so as to face the inner area I of the formwork mould 4.

This adhesive structural material 3 may be applied on the rear face 2b of the photovoltaic module 2 by spraying, by roller or by brush.

This step may be carried out before or after the introduction of the photovoltaic panel 2 into the formwork mould 4.

The adhesive structural material 3 is preferably a polymer, for example an epoxide adhesive or instead an acrylic adhesive.

According to an alternative of the invention, the method may include a prior step of sand-blasting the rear face 2b of the photovoltaic module 2.

This sand-blasting step makes it possible to increase the specific surface area of the rear face 2b of the photovoltaic module 2, which favours the adherence of the polymer.

This step may be followed, if need be, by cleaning with a cloth dampened with solvent to remove dust and facilitate the application of the polymer.

The method next includes a step consisting in pouring fresh concrete 6 into the formwork mould 4 so as to cover the adhesive structural material 3.

The fresh concrete 6 is introduced into the formwork mould 4 via the opening 5 until the final shape of the pre-fabricated element 1 is attained.

The fresh concrete is preferably a high performance concrete or an ultra-high performance concrete.

However, tests have shown that other formulations of concretes would also make it possible to manufacture a pre-fabricated element 1 including a photovoltaic module 2, notably a self-compacting concrete or foamed concrete.

In the case of use of adhesive structural material 3 of the epoxide adhesive type, then the concrete is introduced while the epoxide adhesive is still fluid, typically at the end of 15 minutes after application of the adhesive.

The bonding is carried out at ambient temperature and the input of heat produced by the hydration reaction of the concrete accelerates the bonding.

In the case of use of adhesive structural material 3 of the acrylic adhesive type, then the concrete is only introduced once the adhesive is dry and has cross-linked, typically after 15 to 30 minutes depending on the ambient temperature, knowing that the higher the ambient temperature the shorter the cross-linking time.

Once the adhesive has cross-linked, the fresh concrete 6 may be tipped into the formwork mould 4 for a period that can last up to 48 hours.

The method according to the invention could potentially be used to manufacture so-called thin pre-fabricated elements 1, for example those having a ratio between the length and the thickness greater than around 10, generally having a thickness of 10 to 30 mm, for example façade cladding elements.

Such façade cladding elements are preferably manufactured according to the implementation of the method illustrated in FIGS. 1 and 2 in which the photovoltaic module 2 is placed horizontally against the bottom wall 2e of the formwork mould 4.

More structural pre-fabricated elements 1 are for their part preferably manufactured according to the implementation of the method illustrated in FIGS. 3 and 4 in which the photovoltaic module 2 is placed vertically against a side wall 2a, 2b, 2c, 2d of the formwork mould 4.

Although the invention has been described in relation with particular exemplary embodiments, it is clearly obvious that it is in no way limited thereto and that it includes all the technical equivalents of the means described as well as combinations thereof.

Examples, illustrating the invention without limiting the scope of protection thereof, will be described hereafter.

EXAMPLES

In the following different examples, percentages are expressed as weight percentages.

The examples that follow show how to manufacture a pre-fabricated concrete element intended for construction and electricity production directly after removing from the mould.

The following components, used to manufacture two distinct formulations of concrete, are available from the following suppliers:
(1) White Portland cement: Lafarge-France Le Teil
(2) Grey Portland cement: Lafarge-France Val d'Azergues
(3) Limestone filler, DURCAL 1: OMYA
(4) Limestone filler, BETOCARB HP Orgon: OMYA
(5) Precipitated limestone, SOCAL31: SOLVAY
(6) Silica fumes, MST: SEPR (Société Européenne des Produits Réfractaires)
(7) Sand, BE01: Sibelco France (SIFRACO BEDOIN quarry)
(8) Sand, 0/4 mm: Lafarge France (St Bonnet La Petite Craz)
(9) Gravel, 5/10 mm: Lafarge France (St Bonnet La Petite Craz)
(10) Admixture, Ductal F2: Chryso
(11) Admixture, Optima 203: Chryso
(12) Admixture, EPB 530-027: Chryso
(13) Mapeair LA/L: Mapeï

The Portland cements used are of the CEM I 52.5 type according to the EN 197-1 standard of February 2001. The silica fume has a median particle size of around 1 micrometre.

The photovoltaic modules and the adhesive structural materials of the polymer type, used to exemplify the invention, are available from the following suppliers:
(1) Organic polymer photovoltaic modules (OPV): Disasolar
(2) Polycrystalline silicon photovoltaic modules, Solarmodul 4V/250 mA: Conrad
(3) Polycrystalline silicon photovoltaic modules, Solarmodul 6V/450 mA: Conrad
(4) Flexible, semi-transparent polycrystalline silicon photovoltaic modules, Solarmodul 6V/400 mA: Conrad
(5) Flexible photovoltaic modules PVL-68 made of amorphous silicon 12V/4.1 A: Solariflex
(6) Styrene-butadiene based polymer, INDIL: INDILATEX
(6) Styrene-acrylic based polymer, Acronal S790: BASF
(7) Epoxy based polymer, Resipoly Chrysor C6123: Chryso
Ultra-High Performance Concrete Formulation (1):

The ultra-high performance concrete formulation (1) used to carry out the tests is described in the following table (1):

TABLE (1)

| concrete formulation (1) | |
| --- | --- |
| Components | Proportion (% by weight compared to the total weight of the composition) |
| White Portland cement, Lafarge Le Teil | 31.0 |
| Limestone filler, DURCAL 1 | 9.3 |
| Silica fumes, MST | 6.8 |
| Sand, BE01 | 44.4 |
| Mixing water | 7.1 |
| Admixture, Ductal F2 | 1.4 |

The water/cement ratio is 0.26. It is a concrete having a compressive strength after 28 days greater than 100 MPa.

The ultra-high performance concrete according to the formulation (1) was produced by means of a RAYNERI type mixer. The entire operation was carried out at 20° C. The preparation method includes the following steps:

At T=0 seconds: placing the cement, the limestone filler, the silica fumes and the sand in the mixer bowl and mixing for 7 minutes (15 rpm);

At T=7 minutes: adding the water and half of the weight of admixture and mixing for 1 minute (15 rpm);

At T=8 minutes: adding the remaining admixture and mixing for 1 minute (15 rpm);

At T=9 minutes: mixing for 8 minutes (50 rpm);

At T=17 minutes: mixing for 1 minute (15 rpm).

At T=18 minutes: pouring the concrete flat into the mould(s) provided for this purpose.

Self-Compacting Concrete Formulation (2):

The self-compacting concrete formulation (2) used to carry out the tests is described in the following table (2):

TABLE (2)

| concrete formulation (2) | |
| --- | --- |
| Component | Proportion (% by weight compared to the weight of the composition) |
| Grey Portland cement, Lafarge Val d'Azergues | 16.5 |
| Limestone filler, BETOCARB HP | 8.5 |
| Sand, 0/4 (moisture content 2.2%) | 35.8 |
| Gravel, 5/10 (moisture content 0.26%) | 29.2 |
| Mixing water | 8.1 |
| Admixture, Optima 203 | 1.9 |

The water/cement ratio is 0.49. It is a concrete having a compressive strength after 28 days above 25 MPa.

The self-compacting concrete according to the formulation (2) is produced by means of a SIPE type mixer. The entire operation is carried out at 20° C. The preparation method includes the following steps:

At T=0 seconds: placing the gravel and sand in the mixer bowl and mixing for 20 seconds;

At T=20 seconds: adding the cement and the filler and mixing for 15 seconds (140 rpm); and At T=35 seconds: adding the water and the admixture and mixing for 180 seconds (140 rpm) (TO for the method of measuring the mixing/setting times).

Foamed Concrete Formulation (3):

The foamed concrete formulation (3) used to carry out the tests is described in the following table (3):

TABLE (3)

foamed concrete formulation (3)

| Component | Proportion (% by weight compared to the weight of the composition) |
|---|---|
| Portland cement, Lafarge Le Teil | 67.25 |
| Precipitated limestone, SOCAL31 | 3.05 |
| EPB 530-027 | 0.15 |
| Mapeair LA/L | 0.23 |
| Total water | 29.32 |

A slurry containing the cement, Socal 31, an admixture EPB 530-017 and water is produced using a Perrier mixer for mortar and cement standardised according to the EN-196-1 standard dated April 2006. The water/cement ratio is 0.30. The method for preparing the slurry includes the following steps:

At T=0 seconds: placing the cement and the Socal 31 in the mixer bowl and mixing for 1 minute;
At T=1 minute: adding the water containing the EPB 530-027 slowly over 2 minutes (140 rpm); and
At T=4 minutes: mixing for 180 seconds (280 rpm).

This slurry is next mixed manually with an aqueous foam produced from a 25 g/L solution of Mapeair LA/L. The aqueous foam is produced using a foamer in which the solution is mixed with air to obtain an aqueous foam of 0.045 density.

The fresh density of the foamed concrete is 393 kg/m$^3$, which corresponds to a dry foam density of 350 kg/m$^3$. The compressive strength after 28 days is greater than 0.8 MPa.

Method of Formworking with a Photovoltaic Module Placed Horizontally and a Concrete of Formulation (1):

Slabs were produced by formworking of fresh concrete according to formulation (1) in moulds made of bakelized wood without mould release agent. Different types of photovoltaic modules as described in table (4) were placed distinctly horizontally in contact with the moulds. Different types of polymer as described in table (4) were applied by brush on the rear face of each photovoltaic module.

The thickness of polymer applied was around 1 mm.

In certain cases, the rear face of the photovoltaic module was sand-blasted beforehand for several tens of seconds using SIBELCO BE01 sand.

Then the fresh concrete of formulation (1) was poured inside the mould, 15 minutes after the application of the polymer.

Each concrete slab according to formulation (1) was removed from the mould 18 hours after mixing the cement. After removing from the mould according to the invention, the photovoltaic module adhered well with the hardened concrete and was operational, delivering a measurable voltage, as described in table (4) under a lighting of 100,000 Lux.

The adherence between the photovoltaic module and the polymer was greater if the rear face of the module had been sand-blasted beforehand.

By comparison, the photovoltaic modules placed in contact with the mould and not covered with polymer (comparative method) did not adhere with the hardened concrete after removing from the mould.

TABLE (4)

| Methods tested | Horizontal moulds | Type of photovoltaic module placed in contact with the mould | Sand-blasting the rear face of the photovoltaic module | Polymer applied | Measured voltage | Adherence between concrete and photovoltaic module |
|---|---|---|---|---|---|---|
| Test n°1 according to the invention | Bakelized wood | Organic polymers (OPV) (200 × 90 × 0.1 mm) | Yes | Indilatex, INDIL | 160 mV | Very strong |
| Test n°2 according to the invention | | Polycrystalline silicon, Solarmodul 4 V/250 mA (82 × 120 × 3 mm) | Yes | BASF, Acronal S790 | 4.3 V | Very strong |
| Test n°3 according to the invention | | | Yes | Chryso, Resipoly Chrysor | 4.3 V | Very strong |
| Test n°4 according to the invention | | Polycrystalline silicon, Solarmodul 6 V/450 mA (200 × 200 × 3 mm) | Yes | BASF, Acronal S790 | 6.9 V | Very strong |
| Test n°5 according to the invention | | | Yes | Chryso, Resipoly Chrysor | 6.9 V | Very strong |
| Test n°6 according to the invention | | Flexible and semi-transparent polycrystalline silicon, Solarmodul 6 V/400 mA (200 × 180 × 2 mm) | No | BASF, Acronal S790 | 7.3 V | Weak |
| Test n°7 according to the invention | | | Yes | BASF, Acronal S790 | 7.3 V | Very strong |
| Test n°8 according to the invention | | Flexible, PVL-68 made of amorphous silicon 12 V/4.1 A (2849 × 394 × 4 mm) | Yes | Chryso, Resipoly Chrysor | 11.9 V | Very strong |

TABLE (4)-continued

| Methods tested | Horizontal moulds | Type of photovoltaic module placed in contact with the mould | Sand-blasting the rear face of the photovoltaic module | Polymer applied | Measured voltage | Adherence between concrete and photovoltaic module |
|---|---|---|---|---|---|---|
| Comparative test | | Organic polymers (OPV) 200 × 90 × 0.1 mm) | No | None | / | No adhesion |
| Comparative test | | Polycrystalline silicon, Solarmodul 4 V/250 mA (82 × 120 × 3 mm) | Yes | None | / | No adhesion |

Method of Formworking with a Photovoltaic Module Placed Vertically with the Concrete of Formulation (2):

Slabs were produced by moulding of the concrete according to formulation (2) in vertical steel moulds without mould release agent. Different types of photovoltaic modules as described in table (5) were placed distinctly in contact with the steel moulds. Different types of polymers as described in table (5) were applied by brush on the rear face of each module.

The thickness of polymer applied was around 1 mm.

In certain cases, the rear face of the photovoltaic module was sand-blasted beforehand for several tens of seconds using SIBELCO BE01 sand. Then the fresh concrete of formulation (2) was poured inside the mould, 15 minutes after the application of the polymer.

Each concrete slab according to the formulation (2) was removed from the mould 20 hours after mixing the cement. After removing from the mould, the photovoltaic module adhered well with the hardened concrete and was operational, delivering a measurable voltage, as described in table (5) under a lighting of 100,000 Lux. The adherence between the photovoltaic module and the polymer was greater if the rear face of the cell had been sand-blasted beforehand.

By comparison, the photovoltaic modules placed in contact with the mould and not covered with polymer (comparative method) did not adhere with the hardened concrete after removing from the mould.

Method of Formworking with a Photovoltaic Module Placed Vertically with a Concrete of Formulation (3):

A slab was produced by moulding the concrete according to formulation (3) in a cubic polystyrene mould and without mould release agent. Photovoltaic modules as described in table (6) were placed in contact with the walls of the polystyrene mould.

On the rear face of each module, a polymer such as described in table (6) was applied by brush.

The thickness of polymer applied was around 1 mm.

Then the fresh concrete of formulation (3) was poured inside the mould, 15 minutes after the application of the polymer.

The concrete according to formulation (3) was removed from the mould 20 hours after mixing the cement. After removing from the mould, the photovoltaic modules adhered well with the hardened concrete and were operational, delivering a measurable voltage, as described in table (6) under a lighting of 100,000 Lux.

TABLE (5)

| Methods tested | Horizontal moulds | Type of photovoltaic module placed in contact with the mould | Sand-blasting the rear face of the photovoltaic module | Polymer applied | Measured voltage | Adherence between concrete and photovoltaic module |
|---|---|---|---|---|---|---|
| Test n°1 according to the invention | Steel | Polycrystalline silicon, Solarmodul 4 V/250 mA (82 × 120 × 3 mm) | Yes | BASF, Acronal S790 | 4.3 V | Very high |
| Test n°2 according to the invention | | | Yes | Chryso, Resipoly Chrysor | 4.3 V | Very high |
| Comparative test | | | No | None | / | No adhesion |

TABLE (6)

| Method tested | Mould | Type of photovoltaic module placed in contact with the mould | Polymer applied | Measured voltage | Adherence between concrete and photovoltaic module |
|---|---|---|---|---|---|
| Test according to the invention | Polystyrene | Polycrystalline silicon, Solarmodul 4 V/250 mA (82 × 120 × 3 mm) | BASF, Acronal S790 | 4.3 V | Very strong |

The invention claimed is:

1. Method for manufacturing a pre-fabricated element for construction and electricity production including:
   a) providing at least one photovoltaic module, said at least one photovoltaic module having a front face intended to be oriented towards a light source and a rear face opposite to the front face, said photovoltaic module being covered with a transparent polymer,
   b) providing a formwork mould having side walls and a bottom wall,
   c) introducing the at least one photovoltaic module into the formwork mould, and for this purpose:
      positioning the at least one photovoltaic module against one of the side walls of the formwork mould, the front face of the at least one photovoltaic module being arranged so as to face said side wall, the at least one photovoltaic module being positioned vertically, and/or
      replacing one of the side walls of the formwork mould by all or part of the at least one photovoltaic module, the front face of the at least one photovoltaic module being arranged so as to face an area of the space located outside the mould, the at least one photovoltaic module being positioned vertically,
   d) then depositing an adhesive structural material or a mixture of adhesive structural materials on the transparent polymer of all or part of the rear face of the at least one photovoltaic module arranged so as to face an area of the space located inside the mould, the adhesive structural material including at least one polymer from the epoxide, polyurethane, acrylic, or styrene-acrylic family,
   e) pouring fresh concrete into the formwork mould so as to cover the adhesive structural material.

2. The method of claim 1, wherein the adhesive structural material is of epoxide adhesive type, and the fresh concrete is poured while the epoxide adhesive is still fluid.

3. The method of claim 1, wherein the adhesive structural material is of acrylic adhesive type, and the method further includes a step of drying or cross-linking the acrylic adhesive before pouring the fresh concrete.

4. The method of claim 1, further including a prior step of sand-blasting the rear face of the at least one photovoltaic module.

5. The method of claim 1, wherein the adhesive structural material is applied by spray, by roller or by brush.

6. The method of claim 1, wherein the concrete has a water/cement (W/C) ratio of at the most 1.

7. The method of claim 1, further including a later step of removing from the mould.

8. Method according to claim 7, further including a later step of thermal treatment after the removing from the mould.

9. The method of claim 1, wherein the concrete is a high performance concrete, an ultra-high performance concrete, a self-compacting concrete or a foamed concrete.

10. The method of claim 6, wherein the concrete has a water/cement (W/C) ratio from 0.20 to 0.27.

11. The method of claim 7, wherein the later step of removing from the mould is done 18 hours after the pouring of the fresh concrete.

* * * * *